(12) United States Patent
Schuster (10) Patent No.: US 7,200,920 B2
(45) Date of Patent: Apr. 10, 2007

(54) METHOD FOR THE IMPLEMENTATION OF ELECTRONIC COMPONENTS IN VIA-HOLES OF A MULTI-LAYER MULTI-CHIP MODULE

(76) Inventor: Israel Schuster, 13 Ha' Gomme Street, Kiryat Tivon (IL) 36090

(*) Notice: Subject to any disclaimer, the term of this patent is extended or adjusted under 35 U.S.C. 154(b) by 41 days.

(21) Appl. No.: 10/470,036

(22) PCT Filed: Oct. 25, 2001

(86) PCT No.: PCT/IL01/00991

§ 371 (c)(1),
(2), (4) Date: Dec. 8, 2003

(87) PCT Pub. No.: WO02/060229

PCT Pub. Date: Aug. 1, 2002

(65) Prior Publication Data

US 2004/0113752 A1 Jun. 17, 2004

(30) Foreign Application Priority Data

Jan. 25, 2001 (IL) .................................... 141118

(51) Int. Cl.
*H01C 17/00* (2006.01)

(52) U.S. Cl. .................. 29/610.1; 29/61 R; 29/614; 29/620; 29/621; 204/222; 205/96; 205/103; 205/105; 338/304; 338/314

(58) Field of Classification Search .............. 29/610.1, 29/61 R, 614, 620, 621; 204/222; 205/96, 205/103, 105; 338/304, 314
See application file for complete search history.

(56) References Cited

U.S. PATENT DOCUMENTS 3,303,078 A 2/1967 Rubin (Continued)

FOREIGN PATENT DOCUMENTS

| EP | 491543 | 6/1992 |
| EP | 574206 | 12/1993 |
| EP | 719079 | 6/1996 |

OTHER PUBLICATIONS

"Polymer Resistor Formation in Photo Via" IMB Technical Disclosure Bulletin, IBM Corp. New York, vol. 36, No. 10, Oct. 1, 1993, p. 349; XP000412286.

(Continued)

*Primary Examiner*—A. Dexter Tugbang
*Assistant Examiner*—Tim Phan
(74) *Attorney, Agent, or Firm*—Reed Smith LLP (57) ABSTRACT

The substrate (2) containing the via-hole (3) is inserted into an electrophoretic cell (1) and an electrode (6) (the "first electrode") is placed on top of a first orifice of the via-hole(s) (3), to be implemented with electrical component(s), so that the electrode (6) totally covers the first orifice. Electrically charged either conductive and/or non-conductive particles are provided by immersing the volume of the via-hole(s) (3) in a conductive medium (17) consisting of the electrically charged particles. An electric field is created between the first electrode (6) and a second electrode (4) through the via-hole(s) (3) and the conductive medium (17) and the electrically charged particles are precipitated on the inner surface of the first electrode (6) that is directed to the second orifice of the via-hole(s) (3), until a desired portion of the volume of the via-hole(s) (3) is filled with a first layer of the charged particles having a desired thickness. More layers may be created by repeating this process using additional electophoretic cell(s), until remaining portion of the volume of the via-hole(s) (3) is filled with the additional charged particles.

4 Claims, 5 Drawing Sheets

U.S. PATENT DOCUMENTS

| | | |
|---|---|---|
| 4,300,115 A | 11/1981 | Ansell et al. |
| 5,354,599 A | 10/1994 | McClanahan et al. |
| 5,438,167 A | 8/1995 | McClanahan et al. |
| 5,841,075 A | 11/1998 | Hanson |
| 5,855,755 A | 1/1999 | Murphy et al. |
| 5,872,040 A | 2/1999 | Wojnarowski et al. |
| 5,953,203 A | 9/1999 | Tormey et al. |
| 6,024,857 A * | 2/2000 | Reid .......................... 205/123 |
| 6,040,226 A | 3/2000 | Wojnarowski et al. |
| 6,055,151 A | 4/2000 | Tormey et al. |
| 6,068,782 A | 5/2000 | Brandt et al. |
| 6,303,014 B1 * | 10/2001 | Taylor et al. ............... 205/103 |
| 6,534,116 B2 * | 3/2003 | Basol .......................... 438/667 |

OTHER PUBLICATIONS

Scheifers, S.M.: "A Novel Method . . . Boards" Motorola Technical Developments, Motorola, Inc.,; vol. 36, Sep. 1998, pp. 69-71 XP000850369.

* cited by examiner

METHOD FOR THE IMPLEMENTATION OF ELECTRONIC COMPONENTS IN VIA-HOLES OF A MULTI-LAYER MULTI-CHIP MODULE

CROSS-REFERENCE TO RELATED APPLICATION

This application is the U.S. National Phase under 35 U.S.C. 371 of International Application PCT/IL01/00991, filed Oct. 25, 2002, which claims priority to Israeli Patent Application No. 141118, filed Jan. 25, 2001.

FIELD OF THE INVENTION

The present invention relates to the field of integrated multi-layer multi-chip modules (MCMs), to the manufacture of integrated multi-layer MCMs, and specifically to the manufacture of integrated multi-layer MCMs in which electrical components are produced in the via-holes that provide the electrical continuity between the layers.

BACKGROUND OF THE INVENTION

Many different types of substrate serve as the supporting and interconnecting substrate for electronic components. Resistors, capacitors, inductors, and many other types of electronic component are mounted on the substrate in a predetermined manner and electrically connected together by a metallic conducting pattern that is deposited on its surface to form the required electronic device.

Resistors, capacitors, and other passive components, such as inductors, typically occupy over 50% of the surface area of the substrate. In order to provide more room for active devices (e.g. diodes, transistors, ICs, power sources, etc.) on the surface, as well as to miniaturize the device, multi-layer devices have been constructed. In these devices, electrical circuits consisting of electronic components and conducting patterns are constructed on the substrates that makes up each layer. The layers are electrically connected by via-holes, which are vertical holes that are manufactured through the substrate at the appropriate places to provide conducting paths between the layers.

Many different methods of forming passive electronic circuit elements on substrates have been described. For example:

U.S. Pat. No. 5,855,755 describes the production of passive electronic circuit elements from "electronically conducting polymer films formed from photosensitive formulations of pyrrole and an electron acceptor that have been selectively exposed to UV light, laser light, or electron beams". The production of the electronic circuit elements requires several steps including periods of thermal treatment or of drying either at room temperature. "Because the photopolymerization process may form lines having sides that are not entirely uniform or smooth, it may be difficult to obtain resistors within narrow tolerances without further processing." In applications where precise resistance is necessary, the resistor lines are made wider than necessary and, after curing, each of the resistors is measured and trimmed with a laser to increase the resistance. It may be necessary to carry out the trimming process in several stages to achieve the required accuracy.

U.S. Pat. No. 5,872,040 describes a method in which "thin film electronic components are deposited on a surface, parameter values are measured or estimated, a correction offset file is generated, and the components are trimmed using adaptive lithography." In this example also, many steps are required to produce the electronic components on the substrate and then in the lithography techniques used to trim the films to get the desired electrical values for the elements.

In the currently used methods of producing passive electronic elements, except in the case of parallel plate capacitors in which the substrate itself also serves as the dielectric layer of the capacitor, the elements are produced on one surface of the substrate layers. Thus, creating a multi-layer system results in conducting lines no shorter than the original single layer MCM with the attendant heating, energy loss, and reduced signal to noise ratio.

Most of the existing methods of producing passive elements on substrate surfaces require multi-step, relatively complex, manufacturing processes and relatively large volumes of expensive substrate material. Also, because of the difficulty in controlling the thickness and shape of thin films on the substrate, existing methods result in the production of elements whose electric characteristics vary from their expected values, thus reducing the performance of the device. The accuracy of the components can be improved by trimming them to change their dimensions and therefore their electrical characteristics. This trimming adds to the complexity, time required, and cost of manufacture and sometimes negative results arise such as burning, in the case of laser trimming, or from the harsh chemicals used in lithographic techniques.

U.S. Pat. Nos. 5,953,203 and 6,055,151 disclose methods for producing capacitors on multi-layer ceramic circuit boards, using screen printing techniques, that overcome some of the above mentioned difficulties of the existing methods. In particular, they disclose methods of producing the capacitors that "greatly reduces the shrinkage of the green tapes during firing in the x and y directions, so that most of the shrinkage occurs only in the z, or thickness, dimension". This, presumably, reduces or eliminates the need for trimming of the capacitors. In addition a method of producing buried capacitors, "buried one or two tape layers below the top of the substrate" is disclosed, reducing somewhat the total surface area of substrate required.

The methods disclosed in these patents only partially alleviate the difficulties of the prior art. They are only applicable to multi-layer circuit boards, and not to other types of substrate. They apply only to the production of capacitors, with restrictions on the capacitance values that are achievable. The method of manufacture is complex requiring the build up of many layers, including barrier layers needed to prevent dilution effects caused by diffusion of material from neighboring layers during fixing of the laminated stacks.

There is therefore a need for providing an improved process for manufacturing electronic components for use on integrated multi-layer MCMs that overcomes the limitations of existing methods.

It is a purpose of this invention to provide a method of manufacturing active and passive electronic components for use on integrated multi-layer MCMs that overcomes the limitations of existing methods.

It is an additional purpose of this invention to provide a method of manufacturing passive electronic components on integrated multi-layer MCMs that is less costly than existing methods. It is a further purpose of this invention to provide a device consisting of integrated multi-layer MCMs that results in reduced module size, shorter conducting lines, reduced power consumption, and improved signal to noise ratio.

Other purposes and advantages of this invention will appear as the description proceeds.

SUMMARY OF THE INVENTION

The present invention is directed to a method for the implementation of electrical components in a substrate having via-holes comprising the construction of said components within said via-holes. The method of the invention produces electrical components that may be selected from the group comprising:
- capacitors;
- resistors;
- piezoelectric elements;
- inductors;
- magnetoresistive sensors;
- magnetic actuators; and
- batteries.

The electrical components may be formed from either non-conductive and/or conductive particles that are deposited in predetermined quantities within the via-holes of the substrate. The conductive particles are selected from either metallic or ferro-magnetic particles and the non-conductive particles are selected from the group comprising:
- dielectric particles;
- resistive particles;
- ferromagnetic particles; and
- piezoelectric particles.

The electrical components may be formed by using an electrophoretic deposition (EPD) process that may comprise the following steps:

(a) inserting the substrate containing said via-hole(s) into an electrophoretic cell, placing an electrode (referred to as "first electrode") on top of a first orifice of each of said via-hole(s), to be implemented with electrical component(s), so that said electrode totally covers said first orifice;

(b) providing electrically charged either conductive and/or non-conductive particles by immersing the volume of said via-hole(s) in a conductive medium consisting of said electrically charged particles;

(c) creating an electric field between said first electrode and a second electrode through said via-hole(s) and said conductive medium;

(d) precipitating said electrically charged particles on the inner surface of said first electrode that is directed to the second orifice of said via-hole(s), until a desired portion of the volume of said via-hole(s) is filled with a first layer of said charged particles having a desired thickness; and optionally, if so desired (e) precipitating an additional electrically charged layer, composed of either conductive and/or nonconductive particles, on top of the inner surface of said first layer, using a second electrophoretic cell; and, optionally if so desired (f) repeating the last step using additional electophoretic cell(s) creating more layers, until the remaining portion of the volume of said via-hole(s) is filled with said additional charged particles.

The electrical components may be deposited within the via-holes as one layer composed of a single type of particle, or co-deposited as one layer composed of two or more types of particles, or deposited and/or co-deposited as two or more layers each composed of one or more types of particles The invention is also directed towards electrical components that may be deposited within the via-holes of a substrate and are selected from the group comprising:
- capacitors;
- conductors;
- resistors;
- piezoelectric elements;
- inductors;
- magnetoresistive sensors;
- magnetic actuators; and
- batteries.

The electrical components may be formed from either non-conductive and/or conductive particles that are deposited in predetermined quantities within the via-holes of the substrate. The conductive particles are selected from either metallic or ferro-magnetic particles and the non-conductive particles are selected from the group comprising:
- dielectric particles;
- resistive particles;
- ferromagnetic particles; and
- piezoelectric particles.

The invention is also directed to a substrate containing electrical components implemented within the via-holes of said substrate by a method using an electrophoretic deposition process. The substrate of the invention contains electrical components that may be selected from the group comprising:
- capacitors;
- conductors;
- resistors;
- piezoelectric elements;
- inductors;
- magnetoresistive sensors;
- magnetic actuators; and
- batteries.

The substrate contains electrical components that are implemented by the electrophoretic deposition process.

The invention is also directed to a substrate for a multi-chip module containing electrical components implemented by an electrophoretic deposition process and selected from the group comprising:
- capacitors;
- conductors;
- resistors;
- piezoelectric elements;
- inductors;
- magnetoresistive sensors;
- magnetic actuators; and
- batteries.

The substrate for a multi-chip module of the invention contains electrical components that may be formed from either non-conductive and/or conductive particles that are deposited in predetermined quantities deposited within the via-holes of the substrate. The conductive particles may be selected from either metallic or ferro-magnetic particles and the non-conductive particles may be selected from the group comprising:
- dielectric particles;
- resistive particles;
- ferromagnetic particles; and
- piezoelectric particles.

The electrical components may be deposited within the via-holes of the substrate for a multi-chip module of the invention as one layer composed of a single type of particle, or co-deposited as one layer composed of two or more types of particles, or consist of a first layer, deposited or co-deposited within the via-holes of the substrate in a first EPD cell, and of a second, or more additional layer, sequentially deposited or co-deposited within the via-holes of the substrate in corresponding separate EPD cells, wherein each layer is composed of one or more types of non-conductive or conductive particles.

The invention is also directed to a method for producing a multi-layered multi-chip module in which at least a portion of the electrical components are implemented within the via-holes of the substrates that comprise the layers of the module, further comprising conductive means to connect said electrical components with other components of said multi-chip module located within the via-holes or on the surface of the same, or different, layers of said multi-layered multi-chip module.

The invention is also directed to a multi-layered multi-chip module in which at least a portion of the electrical components are implemented within the via-holes of the substrates that comprises the layers of the module, by a method using an electrophoretic deposition process and which further comprises conductive means to connect the implemented electrical components within the via-holes with other components of the multi-chip module located in the same, or different layers of the multi-layered multi-chip module.

In the preferred embodiment of the present invention, EPD technology is used for producing the desired electronic components within the via-hole. In the EPD process the desired electronic components are produced by the deposition of charged particles onto an electrode immersed in either an aqueous or non-aqueous suspension containing said charged particles in a powder form.

The success of the EPD process depends primarily on the electric charge carried by the particles, which can be controlled through pretreatment of the powder and by addition of surface active agents to the dispersion.

Most ceramics, metals, polymers, and semiconductors can be electrodeposited providing that the powders are suitably dispersed. Thus resistors are produced by depositing resistive particles, capacitors by depositing dielectric particles, and conductors by depositing conductive particles. In addition, piezoelectric elements and rechargeable or nonrechargeable batteries can be created by employing the technology of the invention.

According to one aspect of the invention, the EPD technology may be applied by completely covering the one orifice of the via-hole with one electrode of the EPD cell. The volume of the via-hole is immersed in the suspension, a second electrode is provided, and an electric field is applied between the electrodes through the via-hole and the suspension. This field causes charged particles that were in the suspension to be deposited by EPD onto the inner surface of the electrode, filling the via-hole until a required deposit thickness is obtained. Since the electrical value of the resulting component electrode depends on the known electric constants of the suspended particles (resistance, dielectric constant, etc.) and the dimensions of the component, good agreement between the calculated and manufactured values are achieved. This follows from the fact that the diameters of the via-holes are accurately controlled during their production by methods that are well known to the man skilled in the art (see for example, U.S. Pat. No. 5,841,075). When the charged particles have been deposited to the required thickness, the field is turned off and the substrate is then removed from the EPD cell. The thickness of the deposited layer is a function of the concentration of particles in the suspension, current, and time and consequently it is easily monitored, controllable and reproducible.

If so desired, the process of manufacturing the electrical component is completed by immersing the via-hole into a second EPD cell and depositing conductive particles until the via-hole is completely full.

Alternatively, different particles can be precipitated in the via-hole in any desired order. For example, one or more different electronic components can be formed in the same via-hole. Thus, a part of a circuit consisting of, for example, a resistor and capacitor connected in series can be produced in a single via-hole. Similarly, any other combination of two or more components is possible. The only limitation being the physical capacity of the via-hole. It should be noted that in the case of some of the electrical components, such as batteries, holes of diameters larger than those associated with conventional via-holes are required in order to deposit a sufficient quantity of material to create the component. In this manner, a component, or components, possessing predetermined electrical characteristics has been created in the via-hole. This reduces the overall length of conducting lines in the final circuit; since the depth of the via-holes, which in the existing technology contained only conductors, now contain passive elements and conductors to provide electrical continuity between the layers of the multi-layer system. Since many of the components are now embedded in a vertical direction instead of all of the components being dispersed horizontally on the surface of the layers as in the prior art, the overall volume of the multi-layer system and amount of substrate material required to support the components is reduced.

All of the above and other characteristics and advantages of the invention will be further demonstrated by means of the following illustrative and non-limitative description of preferred embodiments thereof, with reference to the appended drawings.

DETAILED DESCRIPTION OF THE INVENTION

Figure 1:
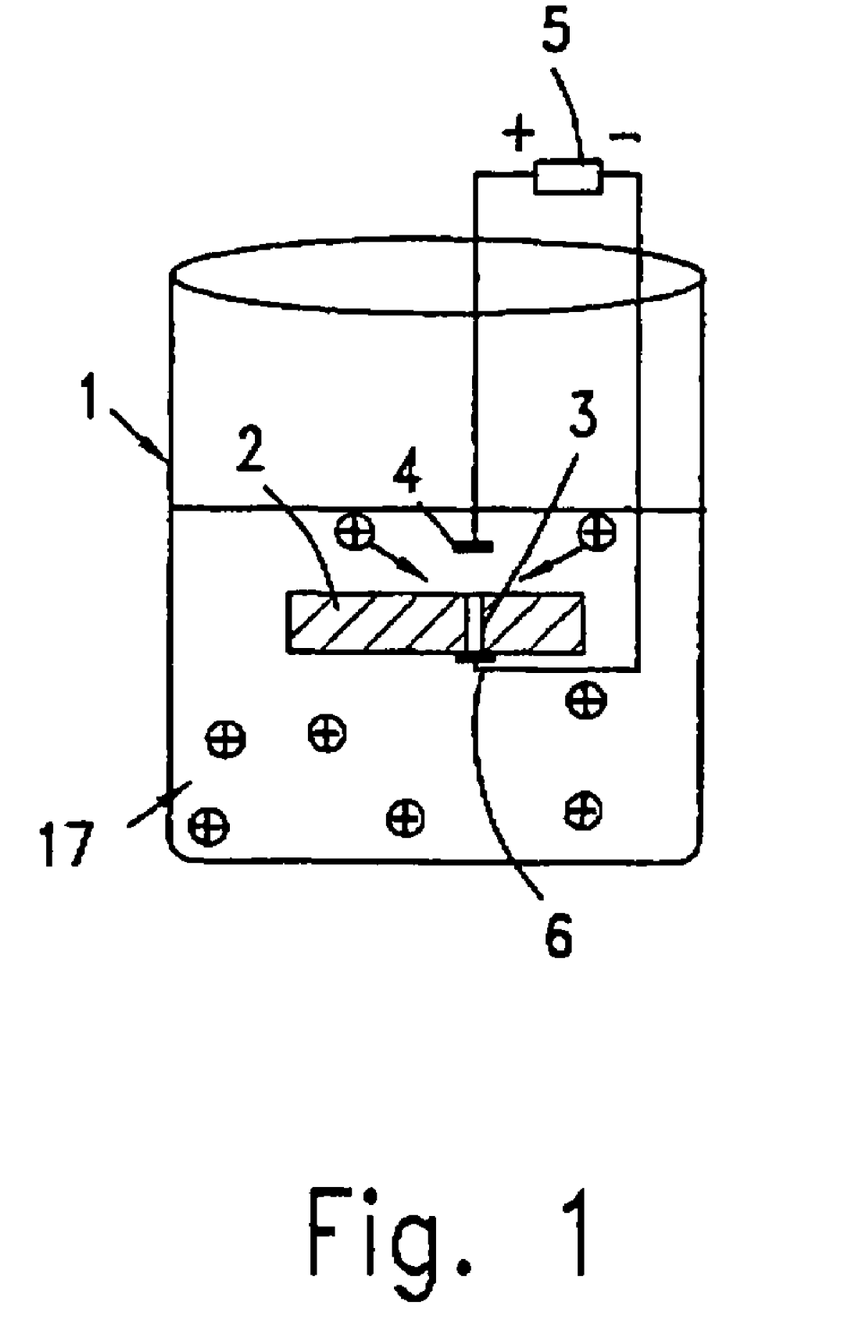
FIG. 1 schematically illustrates a device for carrying out an EPD process.

An electrophoretic deposition (EPD) cell 1 is shown schematically in FIG. 1. The cell 1 consists of a container with an electric circuit consisting of an "upper" positive electrode 4 connected through a DC power supply 5 to a "lower" negative electrode 6. The substrate and electrodes are suspended in a liquid suspension 17.

The suspension consists of particles of the material that has been chosen for the manufacture of the electrical component to which positive electrical charges have been attached by adsorption of ions. The particles are suspended in either water or any other suitable liquid, such as alcohol, depending upon the properties of the powder to be placed in suspension and the type of substrate.

As mentioned above, the particles of the suspension are chosen according to the type of passive component that should be formed and the desired values of the electrical properties of said component. Conductors are produced from metals, including gold, silver, copper, aluminum, nickel, platinum, and palladium. Capacitors are made from high dielectric constant materials such as $BaTiO_3$, $Ta_2O_5$, or PZT. Inductor cores are made from ferromagnetic materials, and resistors from controlled combinations of insulating materials such as glass, ceramics, or polymers with conducting materials such as ruthenium or any of the metals that are used to create conductors.

Using the technology of this invention, it is also possible to manufacture piezoelectric devices having an electrode component consisting of PZT, magnetoresistive sensors from cobalt/copper compositions, and magnetic actuators from materials such as $Tb_{0.30}Dy_{0.70}Fe_{1.92}$. Using EPD it is also possible to create Li and Ni/Cd batteries.

The substrate 2 (in FIG. 1) is placed in the EPD cell 1 such that the via-hole 3 is completely immersed in the suspension. The via-holes are created by techniques that are well known in the art. Much care is taken to maintain a uniform cross section of the hole throughout the entire thickness of the substrates in order to allow production of high quality electrical components. The lower electrode 6 is positioned such that it completely covers the orifice of the via-hole and an electric field is created in the EPD cell. Said electric field causes the electrically charged particles of the suspension to be deposited on the inner surface of electrode 6 that is directed towards the upper orifice of the via-hole.

According to one aspect of the invention, the lower electrode can be part of the conductive pattern deposited on the surface of the substrate. As will be obvious to a man skilled in the art, several identical component electrodes, namely, same electrical component types can be formed in different via-holes at the same time.

Figure 2A:
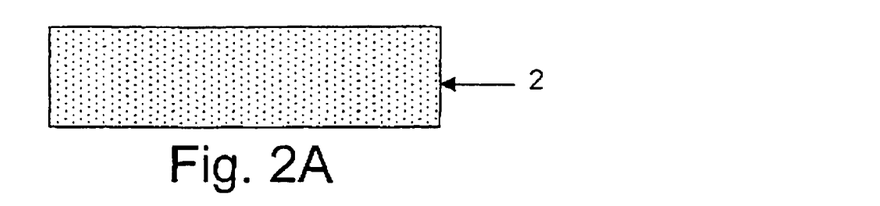
FIG. 2A is a cross-sectional view schematically showing the substrate.
Figure 2B:
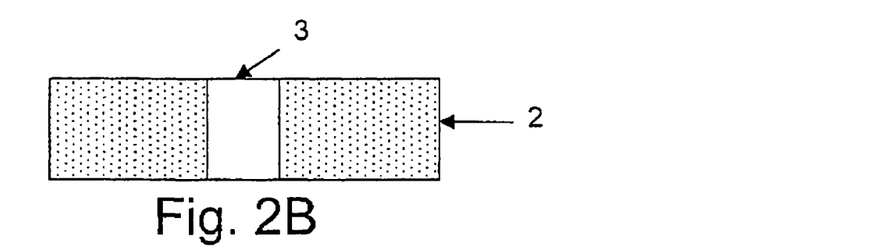
FIG. 2B is a cross-sectional view schematically showing the addition of a via hole to the substrate.
Figure 2C:
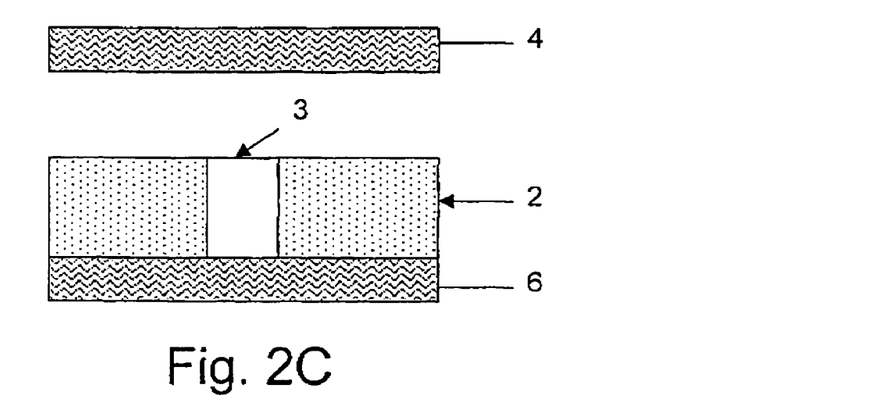
FIG. 2C is a cross-sectional view schematically showing the placement of the electrodes.
Figure 2D:
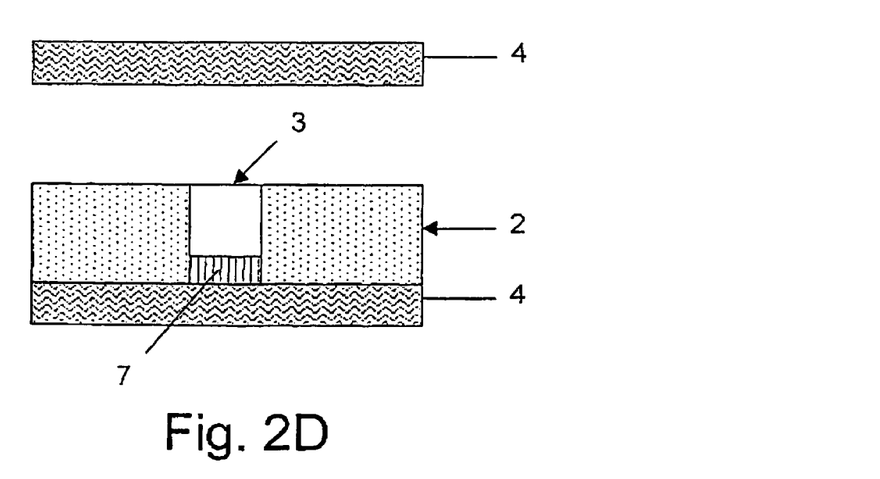
FIG. 2D is a cross-sectional view schematically showing the situation after the deposition of a first layer.

FIGS. 2A through 2G show the EPD process in more detail. The process begins, in FIG. 2A, with a substrate layer generally indicated by the reference numeral 2. In FIG. 2B, the via-hole by the numeral 3 is created. In FIG. 2C, the lower electrode designated by numeral 6 and the upper electrode designated by numeral 4 are placed in position. FIG. 2D shows the situation after the deposition of the first layer designated by numeral 7. In most embodiments, 7 is a conducting layer that serves as a contact point for the element to be created in the via-hole. It is not, however, necessary to begin the process by depositing a conductive layer for example if the electrode 6, is part of the conducting pattern on the surface of the substrate.

Figure 2E:
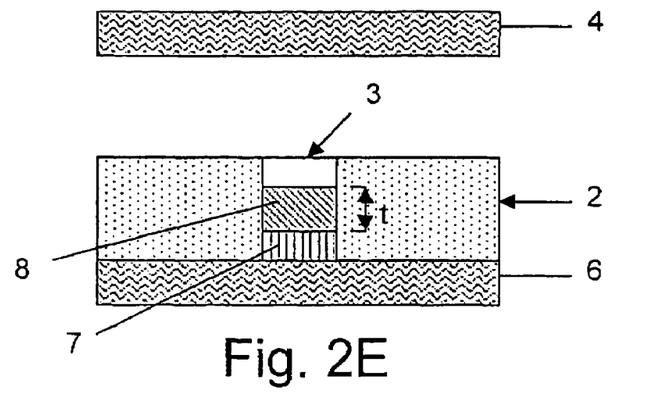
FIG. 2E is a cross-sectional view schematically showing the situation after the deposition of a second layer.

The substrate and electrodes are now removed from the cell containing the conductive material and moved to an EPD cell containing a suspension of particles suitable to form the desired component. It should be noted that, for simplicity, the invention is described in terms of the deposition of a single type of particle, it is possible to co-deposit two or more types of charged particles from the same suspension in order to form electronic components with certain characteristics. FIG. 2E shows the situation at the end of the deposition of the particles that constitute the electronic component 8. The thickness t is easily determined from the desired electric value of the component. For example in the case of a capacitor, the capacitance depends on the cross-sectional area of the via-hole, the dielectric constant of the particles deposited in the EPD process, and the thickness t. Since the via-hole is precisely created, its diameter is known. It is easy to calibrate the EPD cell in order to accurately produce a desired thickness of deposited material, since the dielectric constant of the particles in the suspension is also known.

Figure 2F:
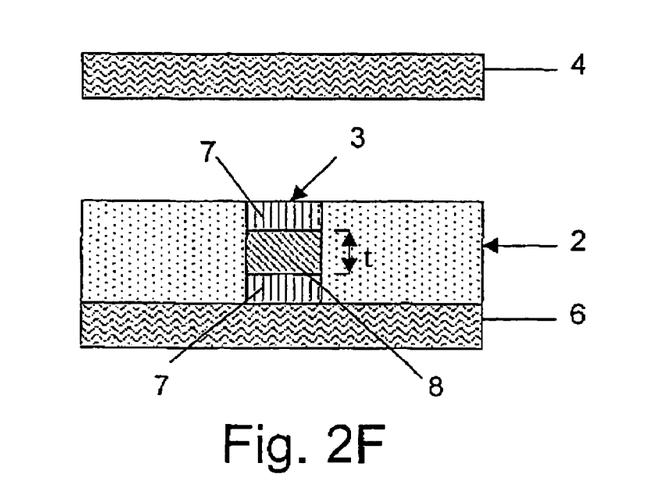
FIG. 2F is a cross-sectional view schematically showing the situation after the deposition of a third layer; and, FIG. 2G is a cross-sectional view schematically showing the situation after completion of the deposition process.
Figure 2G:
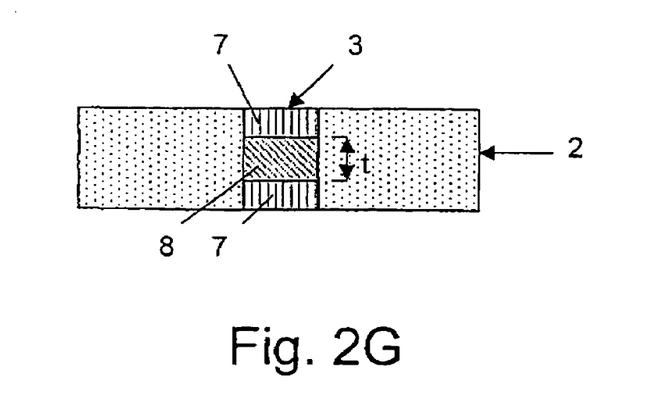

The substrate and electrodes are now removed from the second EPD cell and returned to the first cell containing the conductive material (FIG. 2F). In this step of the process, the remainder of the via-hole is filled with conductive material forming the second contact point of the electronic element. Finally, in FIG. 2G, the electrodes are removed and the substrate, with the electronic element created in the via-hole, is removed from the suspension and dried and treated according to the application, employing techniques well known in the art.

To create an inductor, a spiral conducting pattern is created on the substrate above the upper orifice of the via-hole by techniques well known in the art, for example by screen printing or as disclosed in U.S. Pat. No. 6,040,226. The electrode of the EPD cell is placed over said spiral and orifice and ferromagnetic particles are deposited in the via-hole to produce a ferromagnetic "core" for the inductor. This ferromagnetic layer increases the Q factor of the inductor and allows the use of smaller components to achieve the desired inductance.

In other embodiments of the invention, the substrate and electrodes can be moved to a third EPD cell containing a suspension of different electrically charged non-conductive particles and another or a more complex electrical component can be formed in the same via-hole. This process can be repeated several times forming via-holes with any desired combination of non-conductive and conductive particles forming the electrical components described above.

Deposition of more than one layer in the via-holes is possible using the EPD process because the substrate is moved from one cell to another before the previously deposited layers have had a chance to cure. The layers in the via-hole constitute what is known in the art as a "green body", i.e. they have no mechanical strength and contain cavities filled with solvent that allow for continuation of the electric field necessary for the deposition of subsequent layers. However, the green body is impermeable to the suspended powder material intended for deposition within the via-hole on a previously deposited layer. Although the strength of the electric field in the via-hole will be decreased after the deposition of each layer, it is possible to compensate for this effect by increasing the electrical potential between the EPD electrodes.

An example of an electrical component formed by a multi-layer deposition process is a lithium polymer battery. As discussed previously, to produce a battery, it might be necessary to prepare a hole in the substrate with a diameter larger than that associated with conventional via-holes. The substrate, with the hole of the required diameter is placed in a first EPD cell containing lithium cobalt dioxide powder in suspension. The electrodes are supplied and a layer, that serves as the cathode of the battery is deposited. The substrate is then moved to a second EPD cell containing powders of a polymer composite and a lithium salt which are co-deposited to form the solid polymer electrolyte layer.

Finally, the substrate is moved to a third EPD cell, where a graphite layer, that serves as the anode of the battery is deposited.

When all of the component electrodes in all of the layers are formed in the manner described above; external components, conducting lines, and additional passive components are attached to the various substrates and the final integrated multi-layer electronic device is assembled using conventional techniques. The techniques of the final assembly of integrated multi-layer MCMs are well known, and therefore they are not discussed here.

Figure 3A:
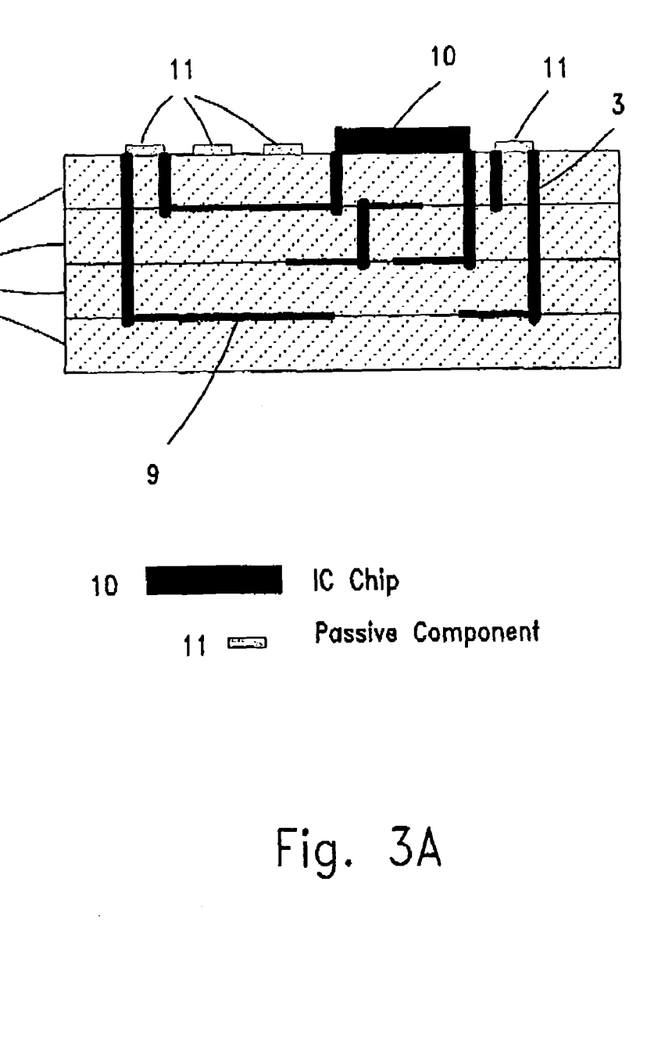
FIG. 3A schematically shows a MCM with the electronic components arranged in a single layer on the surface according to prior art.
Figure 3B:
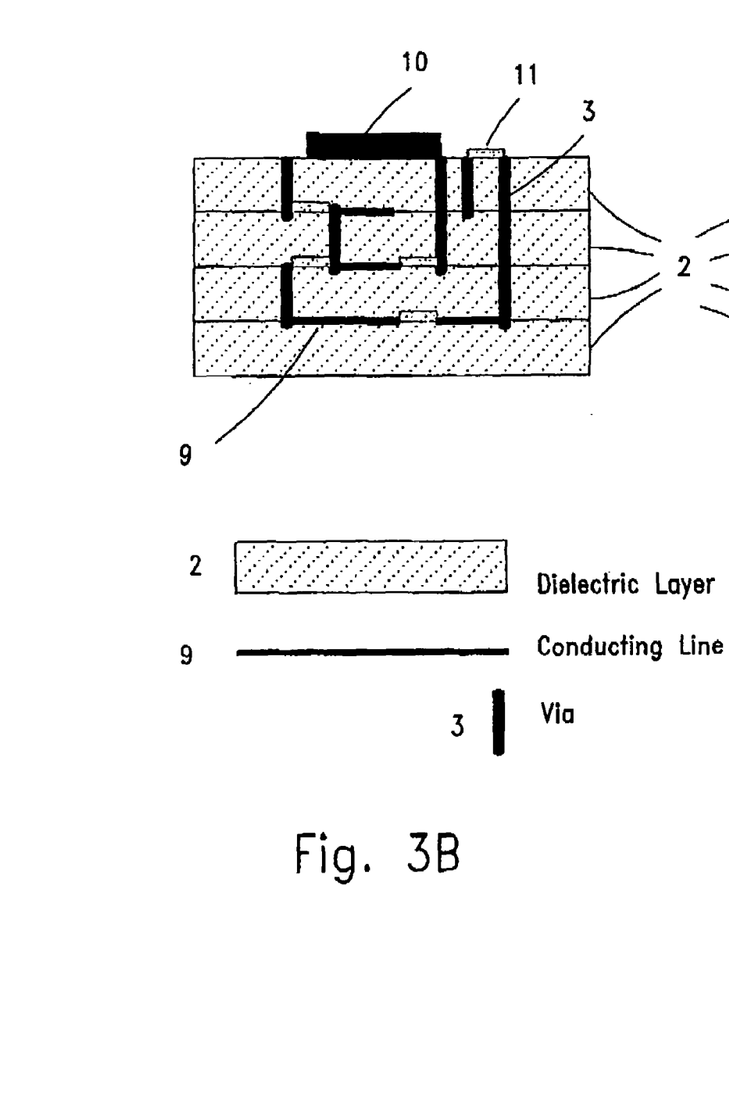
FIG. 3B shows the device of FIG. 3A with passive elements distributed on the surfaces of the different dielectric layers in order to miniaturize the device according to prior art.
Figure 3C:
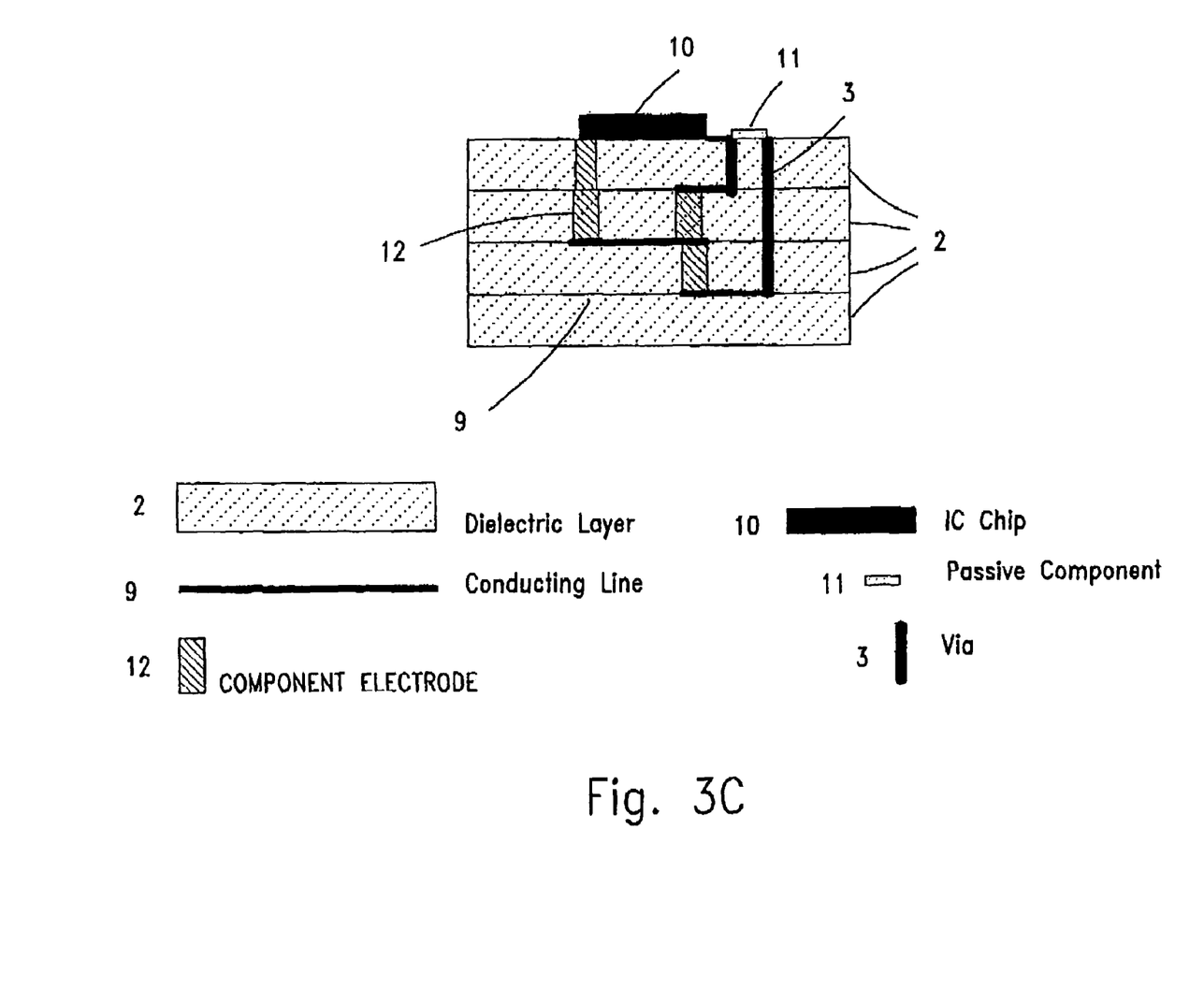
FIG. 3C shows the device of FIG. 3A with passive elements created in the via-holes according to the method of the invention.

FIGS. 3A to 3C show the assembled integrated multi-layer device in which the components are designated as follows: dielectric substrate layers 2, via-holes 3, conducting lines 9, an integrated circuit chip 10, passive components 11, and the component electrodes of the invention 12.

FIGS. 3A and 3B show the assembly according to the methods of the prior art. In FIG. 3B, some of the passive components that are located on the upper surface only of the substrate of FIG. 3A have been relocated on the surfaces of the internal substrates of the multi-layer structure. All of the methods of depositing the film layers that make up the passive electronic components on the surfaces of the substrates suffer from difficulties in accurately controlling the width and thickness of the films. In applications where strict tolerances for the electrical parameters of the components are necessary, considerable time, and therefore expense, must be invested in trimming the films; or, expensive thin-film technology must be employed.

FIG. 3C shows the device of FIGS. 3A and 3B, manufactured according to the method of the invention. It will be recognized by the experienced observer that the method of the invention leads to the construction of a device containing a greatly reduced overall length of conducting lines connecting the electrical components and also to a completed multi-layer structure occupying significantly smaller volume than the equivalent device constructed according to the existing methods.

Although embodiments of the invention have been described by way of illustration, it will be understood that the invention may be carried out with many variations, modifications, and adaptations without departing from its spirit or exceeding the scope of the claims.

The invention claimed is:

1. A method for the implementation of one or more electrical components in the via-holes of a substrate comprising the steps:
    (a) completely immersing said substrate containing said via-holes into an electrophoretic cell containing a liquid suspension consisting of electrically charged conductive or non-conductive particles of material that has been chosen to form the first layer of the first of said one or more electrical components;
    (b) placing a first electrode such that it completely covers a first orifice of each of said via-hole(s), in which said first electrical component is to be implemented;
    (c) providing a second electrode positioned in said electrophoretic cell on the side of said substrate opposite to said first orifice;
    (d) creating an electric potential between said first electrode and said second electrode, which creates an electric field passing through said via-hole(s) and said liquid suspension, thereby causing said electrically charged particles to be deposited on the surface of said first electrode that is directed away from said first orifice of said via-hole(s), until a portion of the volume of said via-hole(s) is filled with a first layer of said charged particles;
    (e) removing said substrate from said electrophoretic cell;
    (f) completely immersing said substrate containing said via-holes into a different electrophoretic cell containing a liquid suspension consisting of electrically charged conductive or non-conductive particles of a different material that has been chosen to form the second layer of the first of said one or more electrical components;
    (g) repeat steps (b) to (e), wherein in step (d) said second layer is deposited within said via-hole on the surface of said first layer; and
    (h) repeat steps (f) and (g) as many times as necessary until said one or more electrical components have been implemented in the via-holes of said substrate.

2. The method according to claim 1 wherein the electrical components are selected from the group comprising:
    capacitors;
    resistors;
    piezoelectric elements;
    inductors;
    magnetoresistive sensors;
    magnetic actuators; and
    batteries.

3. The method according to claim 1, wherein the non-conductive particles are selected from the group comprising:
    dielectric particles;
    resistive particles;
    ferromagnetic particles; and
    piezoelectric particles.

4. The method according to claim 1 wherein the electrical components implemented within the via-holes consist of two or more layers each composed of one or more types of particles that have been deposited or co-deposited within said via-holes.

* * * * *